United States Patent [19]

Jedlicka et al.

[11] Patent Number: 4,954,197
[45] Date of Patent: Sep. 4, 1990

[54] PROCESS FOR ASSEMBLING SMALLER ARRAYS TOGETHER TO FORM A LONGER ARRAY

[75] Inventors: Josef E. Jedlicka, Rochester; Ewart O. LeBlanc, Fairport; Judith A. Masseth, Penfield, all of N.Y.

[73] Assignee: Xerox Corporation, Stamford, Conn.

[21] Appl. No.: 330,664

[22] Filed: Mar. 30, 1989

[51] Int. Cl.⁵ .................... B32B 31/20; B32B 31/28
[52] U.S. Cl. ................................ 156/273.7; 29/467; 29/740; 156/275.7; 156/297; 156/299; 156/562
[58] Field of Search ............... 156/272.2, 562, 275.7, 156/299, 307.1, 297, 308.4, 275.3, 273.7, 275.1, 307.7, 300, 273.3, 263, 304.3, 304.1, 559, 561, 562; 358/43, 44; 437/2; 29/467, 468, 740, 760, 587, 757, 743, 760, 464–465, 559

[56] References Cited

U.S. PATENT DOCUMENTS

| | | | |
|---|---|---|---|
| 4,044,187 | 8/1977 | Kremkau | 156/272.2 |
| 4,222,635 | 9/1980 | Jülke | 156/275.5 |
| 4,388,128 | 6/1983 | Ogawa et al. | 156/64 |
| 4,523,102 | 6/1985 | Kazufumi et al. | 250/578 |
| 4,661,191 | 4/1987 | Kamio et al. | 156/275.5 |
| 4,690,391 | 9/1987 | Stoffel | 156/562 |
| 4,698,113 | 10/1987 | Ogawa | 156/275.7 |
| 4,735,671 | 4/1988 | Stoffel | 156/299 |

Primary Examiner—Merrell C. Cashion, Jr.
Attorney, Agent, or Firm—Frederick E. McMullen

[57] ABSTRACT

A process for fabricating a full width array in which plural smaller chips are bonded end-to-end onto the metallic covering of an elongated substrate by an electrically conductive heat activated adhesive, in which a photocurable adhesive is used to temporarily retain the smaller chips in position while the heat activated adhesive is cured, the process accommodating the inability to cure the photocurable adhesive through the opaque chips and substrate covering by locating the photocurable adhesive so that it extends outside of the boundary of the smaller chips and forms an adhesive fillet or bridge between one side of the smaller chips and the substrate when cured by ultraviolet light.

In an alternate embodiment, the photocurable adhesive is located within the boundary of the smaller chips initially but is squeezed out from below the smaller chips to form the exposed adhesive bridge when the smaller chips are placed on the substrate.

6 Claims, 3 Drawing Sheets

PROCESS FOR ASSEMBLING SMALLER ARRAYS TOGETHER TO FORM A LONGER ARRAY

The invention relates to a process for fabricating image sensor arrays, and more particularly to an improved process for bonding smaller chips together end-to-end to form long image sensor arrays without sacrifice of image quality.

Image sensor arrays for scanning document images, such as Charge Coupled Devices (CCDs), typically have a row or linear array of photosites together with suitable supporting circuitry integrated onto silicon. Usually, an array of this type is used to scan line by line across the width of a document with the document being moved or stepped lengthwise in synchronism therewith.

In the above application, the image resolution of the array is proportional to the ratio of the scan width and the number of photosites. Because of the difficulty in economically designing and fabricating long arrays, image resolution for the typical array commercially available today is relatively low when the array is used to scan a full line. While resolution may be improved electronically as by interpolating extra image signals, or by interlacing several smaller arrays with one another in a non-colinear fashion so as to crossover from one array to the next as scanning along the line progresses, electronic manipulations of this type adds to both the complexity and the cost of the system. Further, single or multiple array combinations such as described above usually require more complex and expensive optical systems.

A full width array having a length equal to or larger than the document line and with a large packing of co-linear photosites to assure high resolution, has been and remains a very desirable but so far unattainable aim. While forming a full length array by assembling several smaller arrays, referred to as chips herein together end-to-end has often been postulated, there has nevertheless existed the problem of successfully fabricating the composite array such that the smaller chips that make up the longer array are in precise and exact alignment, with the chip ends in close abutting relation with one another so that loss or distortion of image data is avoided.

In the prior art, Pat. Nos. 4,523,102; 4,388,128; and 4,661,191 to Kazufmui et al, Ogawa et al, and Kamio et al, respectively, disclose processes for bonding color filters to image sensor chips in which a heat activated-ultraviolet curable adhesive is used to bond the color filters to the chip. In these prior art processes, the adhesive is first cured partially by exposing the adhesive to ultraviolet light, with curing completed through the application of heat. These prior art processes are enabled by virtue of the transparent nature of the filter, allowing the ultra violet light to pass through the filter and strike the adhesive. A further prior art disclosure, Pat. No. 4,698,113 to Ogawa, discloses a process for cementing lens elements in which various types of photocurable-heat activated adhesive combinations are provided which are designed to assure curing of the adhesive where impingement of the ultraviolet rays is prevented by dark bands in the color filter.

In contrast, the present invention provides an improved process for fabricating a full width array consisting of an assembly of smaller opaque chips mounted on an elongated substantially opaque substrate in end-to-end abutting relation to one another, comprising the steps of: applying a discrete amount of an electrically conductive heat activated adhesive at points on the substrate where each of the chips are to be fastened in predetermined position; applying a discrete amount of a photocurable adhesive to the substrate adjacent to and spaced from each of the heat activated adhesive amounts, the photocurable adhesive being located so that when the chips are placed in predetermined position on the substrate, at least a portion of the photocurable adhesive remains uncovered by and outside of each chip along at least one side of each chip; placing the chips in predetermined position on the substrate with the chips atop the heat activated adhesive and partially atop the photocurable adhesive; exposing the chip and substrate assembly to ultraviolet light to activate the exposed portions of the photocurable adhesive and establish a temporary adhesive bridge between the one side of each chip and the substrate; repeating the above for each chip in the assembly; and heating the assembly with the chips temporarily held in place by the photocurable adhesive to cure the heat activated adhesive and permanently bond the chips to the substrate.

IN THE DRAWINGS

Figure 1:
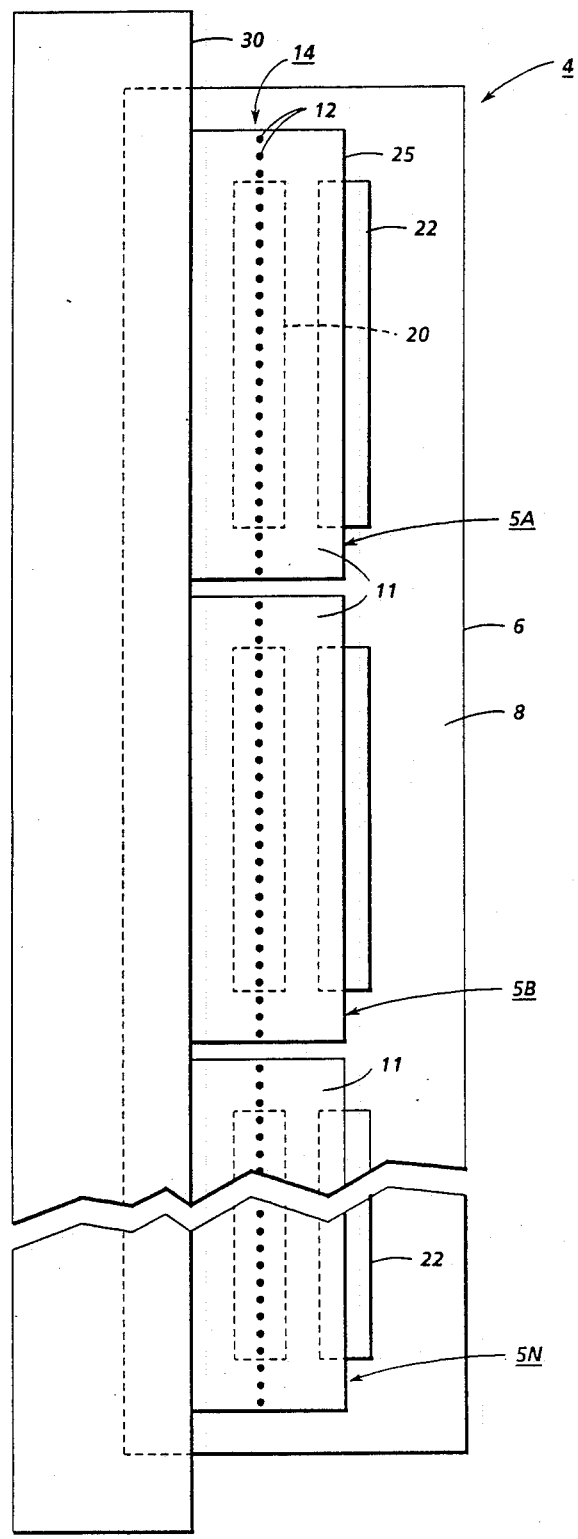
FIG. 1 is a top view illustrating a full width array comprised of plural smaller chips assembled in end-to-end relation and bonded together in accordance with the process taught by the present invention.
Figure 2:
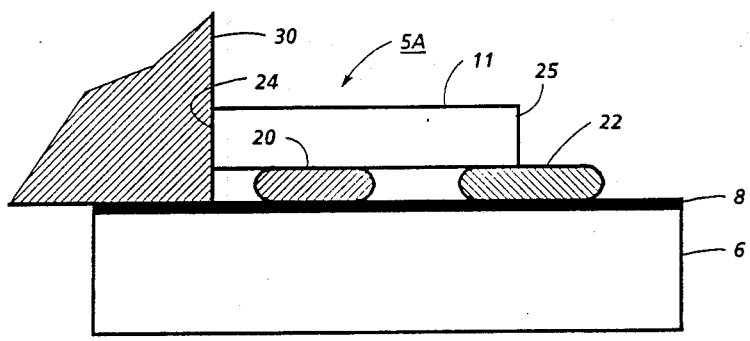
FIG. 2 is an enlarged view in cross section illustrating the relative positions of the heat activated and photocurable adhesives at the start of the process.
Figure 3:
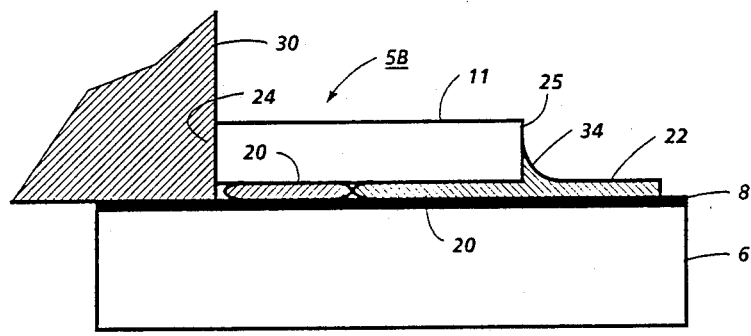
FIG. 3 is an enlarged view in cross section illustrating the relative positions of the heat activated and photocurable adhesives following placement of a chip on the substrate.

Referring particularly to FIGS. 1-3 of the drawings, there is shown a long or full width scanning array 4 composed of a plurality of smaller sensor chips or arrays 5 assembled together end-to-end (specific chips are identified by numerals 5A, 5B, . . . 5N) on an elongated generally rectangular substrate 6. An electrically conductive metallic covering or coating 8 such as copper is provided on the side of substrate 6 to which the chips 5 are attached. As will be understood, metallic coating 8 is substantially opaque and may comprise either a thin film coating (i.e., ≦10 um) or a thick film coating (i.e., approximately 11 um–approximately 50 um)

As will be understood by those skilled in the art, array 4 is typically used to read or scan a document original line by line and convert the document image to electrical signals. Preferably, array 4 is a full width array having an overall length equal to or slightly greater than the width of the largest document to be scanned.

Chips 5, which may for example be Charge Coupled Devices (CCDs), comprise a relatively thin silicon die 11 having a generally rectangular shape. A row 14 of photosites 12 parallels the longitudinal axis of the chips. While a single row 14 of photosites 12 is shown, plural photosite rows may be contemplated. Other active elements such as shift registers, gates, pixel clock, etc., are preferably formed integral with die 11. Suitable external connectors (not shown) are provided for electrically coupling the chips 5 to related external circuitry. As will be understood, chips 5 are opaque.

When a single chip 5 is used for scanning purposes, the image resolution achieved is a function of the number of photosites 12 that can be fabricated on the chip divided by the width of the scan line. Since the number of photosites 12 that can be packed onto a single chip is limited, it is advantageous to assemble plural chips together in a longer array, and preferably to form a full width or full size array whose scan area is coextensive with the scan line. In the present invention, a plurality of chips 5A, 5B, . . . 5N are secured in abutting end-to-end relation on surface 8 of substrate 6 to form a continuous and uninterrupted row of photosites with a substantially uniform periodicity.

In order to secure chips 5 in place on surface 8 of substrate 6, a suitable heat activated thermal setting electrically conductive adhesive or epoxy 20 is placed on the metallic coating 8 at the point where each chip is to be attached. In order to retain the chip 5 in position pending activation of adhesive 20, a second suitable photocurable adhesive 22 is used. As shown in the drawing FIGS. 1–3, adhesive 22 is applied to metallic coating 8 of substrate 6 at a point adjacent to but spaced from adhesive 20, with the spread of adhesive 22 being such as to cover an area extending from a point underneath one side 25 of chip 5 to a point outside the chip when chip 5 is positioned on substrate 6.

During assembly of the full width array 4, a first chip 5A is positioned on substrate 6, the chip being located through abutment of the opposite side 24 of chip 5 against an alignment bar 30. Assembly may be any suitable apparatus such as a collet of an automatic placement machine (not shown). When positioned, the chip 5 covers heat activated adhesive 20 and partially covers over photocurable adhesive 22. Application of pressure to the chip 5A spreads the adhesives 20, 22 out, forcing or squeezing some of the photocurable adhesive 22 from under the chip and onto the surface of the metallic coating 8 adjacent the chip side 25. The portion of the photocurable adhesive exterior of the chip 5A, supplemented by the adhesive squeezed out from below the chip, forms a fillet-like mass, bridging between the side 25 of the chip and the metallic coating 8. As a result, a fillet-like bridge 34 of photocurable adhesive is created between side 25 of the chip and the adjacent surface of the metallic coating 8 on substrate 6.

With chip 5A in position, photocurable adhesive 22 is exposed to ultraviolet light, curing the adhesive and forming a film adhesive fillet-like bridge 34 of adhesive between the side 25 of chip 5A and the metallic coating 8 on substrate 6. It is understood that inasmuch as ultraviolet light cannot pass through non-transparent surfaces such as the chip itself or the metallic coating 8, curing of adhesive 22 is substantially limited to the exposed parts of the adhesive on the exterior of the chip and the substrate.

The remaining chips 5B, . . . 5N are similarly positioned on substrate 6 and temporarily held in place on the substrate by the aforedescribed adhesive bridge 34 that is formed.

Following positioning and securing of the last chip 5N on substrate 6, the assembly with chips 5A, 5B, . . . 5N temporarily held in place by adhesive 22, is heated to the temperature required to cure or set heat activated adhesive 20, permanently fixing the chips 5 in place. Heating also completes curing of any photocurable adhesive 22 that is masked from exposure to ultraviolet light by the opaque chip itself.

Figure 5:
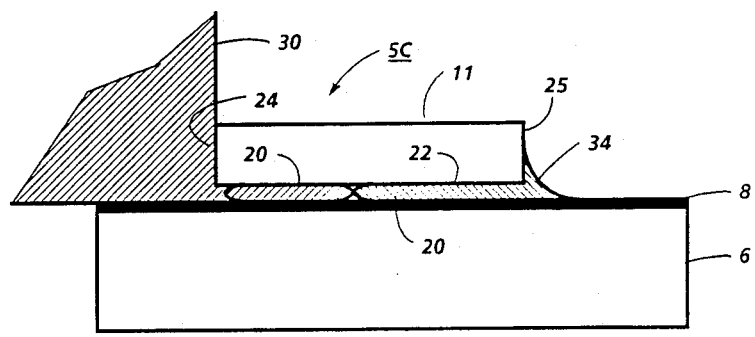
FIG. 5 is an enlarged view in cross section illustrating the relative positions of the heat activated and photocurable adhesives in the FIG. 4 embodiment following placement of a chip on the substrate.
Figure 4:
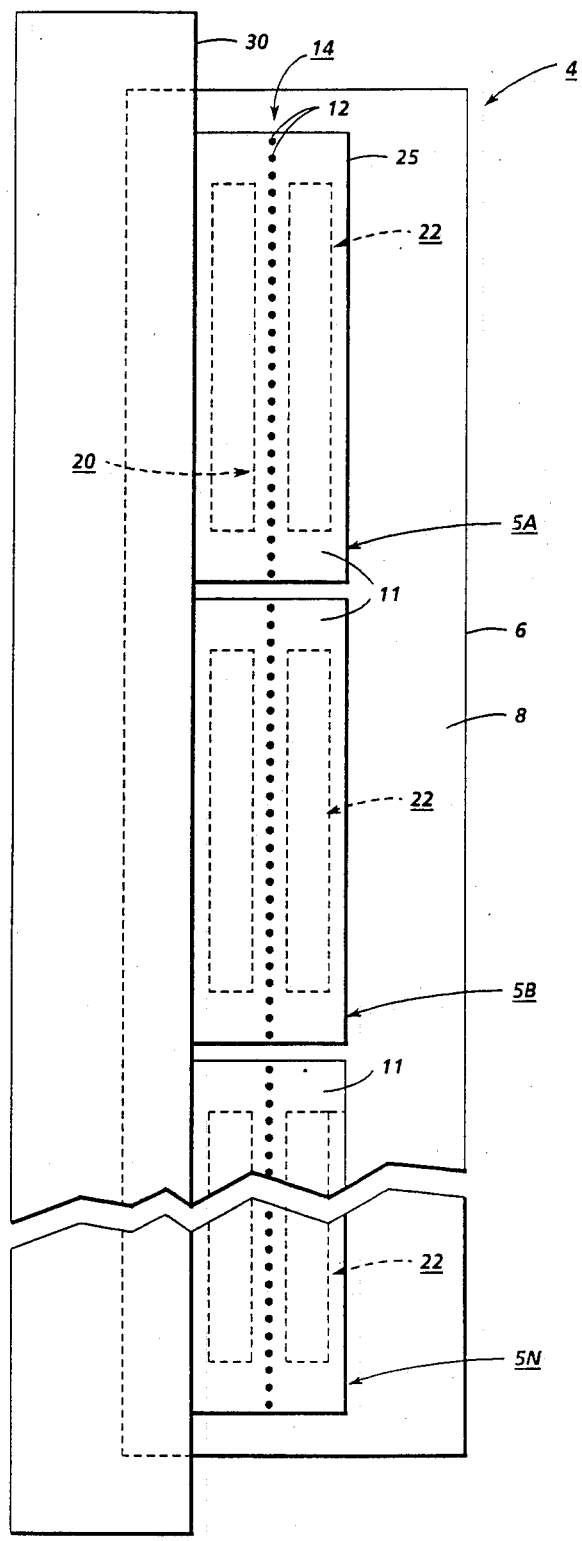
FIG. 4 is a top view illustrating an alternate process for bonding plural smaller chips together to form a full width image array.

In the embodiment shown in FIGS. 4 and 5, where like numbers refer to like parts, the photocurable adhesive 22 is placed adjacent to and spaced from the heat activated adhesive 20, with the adhesive 22 within the confines of the chip 5A. In this embodiment, the amount of adhesive 22 applied is such that on application of pressure between the chip and the substrate, a sufficient amount of adhesive 22 is present so that a portion of the adhesive 22 is forced out from under the side 25 of the chip and onto the metallic coating 8 along side 25 of the chip, forming the aforedescribed adhesive bridge 34. The exposed photocurable adhesive 22 is then cured by ultraviolet light to temporarily secure the chip in place as described. Following positioning and securing of the last chip 5N on substrate 6 by the adhesive bridge 34 that is formed, the assembly is heated to set the heat activated adhesive 20 and permanently fix the chips in place on substrate 6 as described.

While assembly of a full width scanning array 4 has been described as taking place on a per chip basis, it is understood that all of the chips 5 that comprise scanning array 4 may be first positioned on substrate 6, following which all of the chips are exposed to ultraviolet light to set the photocurable adhesive of all the chips at once. Alternately, as may be understood, several scanning arrays 4 may be processed simultaneously in the manner described.

Further, while the invention has been described in the context of fabricating a full width scanning array, other devices that require similar assembly from a plurality of smaller parts or sub-assemblies such as an ink jet array may be formed by the process of the present invention.

While the invention has been described with reference to the structure disclosed, it is not confined to the details set forth, but is intended to cover such modifications or changes as may come within the scope of the following claims.

We claim:

1. A method of fabricating a full width array comprised of a plurality of discrete chips mounted on an elongated substantially non-transparent substrate in end-to-end abutting relation to one another, comprising the steps of:
    (a) applying a discrete amount of heat activated adhesive to said substrate where each of said chips is to be mounted, said heat activated adhesive being electrically conductive to allow electrical contact of said chips with said substrate;
    (b) applying a discrete amount of a photocurable adhesive to said substrate adjacent to and spaced from each of said heat activated adhesive amounts, said photocurable adhesive amounts being located so that on mounting of said chips on said substrate, an exterior fillet-like mass of photocurable adhesive is created forming an adhesive bridge spanning between at least one side of said chips and said substrate;
    (c) mounting said chips on said substrate over said heat activated and said photocurable adhesives;
    (d) exposing said photocurable adhesive to ultraviolet light whereby the portion of said photocurable adhesive forming said adhesive bridge is cured to temporarily bond said chips to said substrate;
    (e) heating said heat activated adhesive to permanently bond said chips in position on said substrate.

2. The method according to claim 1 including the step of applying a conductive coating to the side of said substrate on which said chips are mounted prior to applying said heat activated and photocurable adhesives thereto.

3. The method according to claim 1 including the step of:
applying said discrete amoount of said photocurable adhesive on said substrate such that a part of said photocurable adhesive is outside the boundary of said chips when said chips are mounted on said substrate.

4. The method according to claim 1 including the step of:
(a) applying said discrete amounts of said photocurable adhesive on said substrate such that said photocurable adhesive is within the boundary of said chips when said chips are mounted on said substrate; and
(b) mounting said chips on said substrate so that a part of said photocurable adhesive is squeezed out from said chips to form said adhesive bridge.

5. An improved process for fabricating a full width array consisting of a plurality of discrete opaque chips mounted on an elongated substantially opaque substrate in end-to-end abutting relation to one another, comprising the steps of:
(a) applying a discrete amount of heat activated adhesive to said substrate, said heat activated adhesive being electrically conductive to allow electrical contact of said chips with said substrate;
(b) applying a discrete amount of a photocurable adhesive to said substrate adjacent to and spaced from said heat activated adhesive amount, the photocurable adhesive being located so that on mounting one of said chips on said substrate, there is formed an exterior fillet-like bridge of photocurable adhesive between one side of said one chip and said substrate;
(c) mounting said one chip on said substrate with said one chip covering said heat activated adhesive and partially covering said photocurable adhesive whereby a part of said photocurable adhesive is exterior of said one chip;
(d) exposing the exterior part of said photocurable adhesive to ultraviolet light to cure said photocurable adhesive and establish a temporary adhesive bridge between said one chip one side and said substrate;
(e) repeating steps a–d for each of the remaining ones of said chips in said full width array; and
(f) heating said full width array with said chips temporarily held in place by said bridge of photocurable adhesive coated between each of said chips and eaid substrate to cure the heat activated adhesive and permanently bond said chips to said substrate.

6. A method of fabricating a full width array from a plurality of discrete chips mounted on an elongated substantially non-transparent substrate in end to end abutting relation to one another, comprising the steps of:
(a) applying a photocurable adhesive to said substrate at points where each of said chips are to be mounted;
(b) applying a heat activated adhesive to said substrate at points adjacent to and spaced from each of the points where said photocurable adhesive is applied.
said photocurable and heat activated adhesive points being located such that when said chips are mounted on said substrate, a portion of said photocurable adhesive is exposed and forms an adhesive bridge spanning between at least one side of each of said chips and said substrate;
(c) mounting said chips in end to end abutting relation with one another on said substrate with each of said chips on the photocurable and heat activated adhesives associated therewith whereby to provide said adhesive bridge comprised of said exposed photocurable adhesive with each chip;
(d) exposing said exposed photocurable adhesive to ultraviolet light to cure said exposed photocurable adhesive and form adhesive bridges for temporarily bonding said chips to said substrate; and
(e) heating said heat activated adhesive to permanently fix said chips in position on said substrate.

* * * * *